United States Patent [19]

Helda et al.

[11] 4,003,073
[45] Jan. 11, 1977

[54] INTEGRATED CIRCUIT DEVICE EMPLOYING METAL FRAME MEANS WITH PREFORMED CONDUCTOR MEANS

[75] Inventors: Robert W. Helda, Hollywood, Fla.; Harry J. Geyer, Phoenix, Ariz.

[73] Assignee: Motorola, Inc., Chicago, Ill.

[22] Filed: Oct. 10, 1972

[21] Appl. No.: 296,186

Related U.S. Application Data

[60] Division of Ser. No. 56,081, June 29, 1970, Pat. No. 3,698,974, which is a continuation of Ser. No. 691,040, Dec. 15, 1967, abandoned.

[52] U.S. Cl. .................. 357/70; 357/68; 357/69; 357/72; 357/73
[51] Int. Cl.² .............. H01L 23/48; H01L 23/28; H01L 23/30
[58] Field of Search ........... 317/234, 3, 5.4; 357/68, 69, 70, 72, 73

[56] References Cited
UNITED STATES PATENTS 3,544,857   12/1970   Byrne et al. .................. 317/234

*Primary Examiner*—Edward J. Wojciechowicz
*Attorney, Agent, or Firm*—Foorman L. Mueller; Henry T. Olsen

[57] ABSTRACT

Wire bonding is eliminated in the assembly of microelectronic devices, by a process involving the direct bonding of circuit electrodes to an unsupported metallic sheet-frame member having a plurality of inwardly extending leads. A single-step vibratory pressure welding technique is employed for the simultaneous bonding of all leads to a semiconductor integrated circuit chip. Lateral confinement of the leads during the bonding steps causes a buckling action to introduce a small but critical loop in each lead to ensure clearance between the lead fingers and the perimeter of the semiconductor chip, whereby electrical shorting is avoided. The loop also provides a structural flexibility in the leads, which tends to protect the bonding sites from excessive stresses. Subsequently, the first frame member including the bonded circuit is attached, preferably by resistance welding, to a second lead frame member of heavier gage and increased dimensions, suitable for connection with external circuitry. Excess portions of the first frame member are then removed, providing a completed assembly for packaging; e.g., plastic encapsulation or hermetic sealing, as in a ceramic-glass flat package.

2 Claims, 12 Drawing Figures

INTEGRATED CIRCUIT DEVICE EMPLOYING METAL FRAME MEANS WITH PREFORMED CONDUCTOR MEANS

The present application is a divisional of application Ser. No. 56,081 filed June 29, 1970, now U.S. Pat. No. 3,698,974 which latter application is a continuation of application Ser. No. 691,040 filed Dec. 15, 1967, and now abandoned and is related to the application of Robert W. Helda Ser. No. 80,378 filed Oct. 13, 1970 as a continuation of application filed Dec. 15, 1967 as Ser. No. 691,041, and now abandoned.

BACKGROUND

This invention relates to the assembly and packaging of microelectronic devices, including particularly the contact bonding and assembly of integrated semiconductor circuits.

Various methods have been proposed for providing electrical connections between the ohmic-contact areas of an integrated microcircuit and the external package leads. The most common method in current use involves the thermocompression bonding of extremely fine wires to the points to be interconnected. In accordance with this technique, a 14-lead device, for example, requires 28 separate bonding steps, each requiring a careful positioning of the partially assembled device in the bonding apparatus.

The industry has recognized for some time that it would be desirable to eliminate the time and expense of wire bonding. Considerable attention has been devoted to the expedient of simply extending the internal portions of the package leads and tapering the lead ends to provide bonding tips which are small enough for attachment directly to the bonding pads of the semiconductor structure. This approach has not been successful, primarily due to the fundamental difference in structural specifications required for external package leads as compared with the specifications required of internal leads bonded to the ohmic-contact areas of a microcircuit.

For example, the use of external package leads made of 10-mil Kovar has become a standard practice for many devices. Efforts to bond 10-mil Kovar leads directly to the electrodes of an integrated circuit have proved disappointing. High-speed techniques for gold or aluminum wire bonding, such as thermocompression bonding and vibratory pressure welding, do not readily produce a reliable bond when applied to leads as thick as 10-mils, or when applied to metal leads which are less ductile than gold, aluminum, or copper, for example. Even when acceptable bonds are initially formed using a 10-mil lead frame, the leads are very susceptible to inadvertent detachment from the die as a result of subsequent stresses introduced by normal handling and incidental flexing of the assembly.

It has also been proposed to replace bonding wires with individual rigid metal clips for interconnecting the bonding pads of the semiconductor circuit with the external leads. This approach may be advantageous for some applications, but it has not been found to reduce the cost of assembly substantially.

It is also known to deposit a metallic pattern of interconnecting leads on a ceramic base or other support, such that an integrated circuit die having built-up electrodes may be inverted and contact bonded face down to the metallic pattern. This approach is objectionable because of high costs, and because the bonding sites are hidden from visual inspection. Therefore, any defective bonds will escape detection until the device can be electrically tested.

THE INVENTION

It is an object of the invention to provide an improved method for the manufacture of electrical devices. More particularly, it is an object of the invention to provide an improved method for contact-bonding and packaging of a microelectronic integrated circuit structure.

It is a further oject of the invention to provide a new approach to the problem of electrically connecting the ohmic-contact pads of an integrated circuit with the external lead wires of a packaged device. More particularly, it is a further object of the invention to provide an improved pressure welding method for the simultaneous cold bonding of all lead members to the contact pads in a single step, with a more effective use of high frequency vibrations to augment the welding. The high temperature required in thermocompression bonding is thereby avoided.

A primary feature of the invention is the use of first and second electrically conductive, substantially flat sheet-frame members having a plurality of inwardly extending fingers or leads. The first lead frame member is the relatively smaller and lighter of the two, the plurality of inwardly extending lead ends thereof being adapted for alignment with and bonding to the electrode pads of an integrated circuit structure. The second lead frame member is larger and heavier than the first, being constructed of a material well suited for use as the external leads of a packaged device. The plurality of inwardly extending leads of the second frame member terminates in a pattern adapted for alignment with and bonding to the respective leads of the first frame member at points generally located outside the periphery of the integrated circuit structure.

Another feature of the invention is the simultaneous cold bonding of all lead terminals of the first frame member to the corresponding electrode pads of the circuit structure in a single step. The bonding is achieved by positioning the lead frame and the circuit die in proper alignment, i.e., with each lead terminal in contact with a corresponding circuit bonding pad, and then applying bonding energy simultaneously to all bonding sites. Specifically, a pressure weld is formed simultaneously at each bonding pad by applying compressive force in combination with high-frequency vibrations. The bonding needle is applied to the reverse side of the circuit chip, opposite the bonding pads, whereby the vibrational energy passes through the semiconductor body and is transferred uniformly to all bonding sites. The face of the chip, with each lead terminal in contact with a corresponding pad, is rigidly supported during the bonding step by a pedestal or "bottom needle" of a particular configuration.

An additional feature of the invention relates to the buckling or looping of the leads of the first frame member during the bonding operation, accomplished by a lateral confinement of the leads. Since the bonding step involves a substantial deformation of the lead terminals, axial or longitudinal stress is introduced along the lead elements, sufficient to cause a significant buckling of the leads in the direction of minimum resistance. A clearance is thereby provided between the leads and the edges of the circuit chip, which avoids the danger of electrical shorting.

In accordance with a more specific aspect of this feature of the invention, the buckling may be substantially enhanced by providing a short segment of reduced cross section in each lead at some point near the edge of the circuit chip. The buckling action introduces a small permanent loop in each lead providing a structural flexibility which tends to relieve the bonding sites of excessive inadvertent stresses.

The invention is embodied in a method for contact bonding and packaging of an integrated circuit structure, including the use of an electrically conductive, substantially flat first frame member having a plurality of inwardly extending fingers or leads having unsupported ends adapted for alignment with and bonding to the electrodes of the integrated circuit. Typically, the first lead frame member is prepared from sheet aluminum or copper having a tensile strength of 10,000 to 24,000 p.s.i. and a thickness of about 1.5 to 4.0 mils, preferably about 2 mils. Other metals may be employed. The exact configuration of the leads may suitably be provided by chemical etching or mechanical stamping procedures well known in the art of metal fabrication. Advantageously, an elongated rectangular strip is provided which includes a plurality of identical frame members equally spaced along the length of the strip. The extreme flexibility of the first lead frame member permits it to be easily stored in the form of a continuous strip or belt wound on a spool, from which it is unwound for use as needed.

The method further includes the step of aligning and bonding the electrodes of the circuit die to the lead terminals of the first frame member by the simultaneous application of compressive force and high-frequency vibrations to all bonding sites in a single step. The preferred technique is to employ a bonding needle having a flat tip of an area sufficient to contact a major proportion of the area of the circuit die. The bonding needle tip is pressed against the reverse side of the circuit die, while rigid support means are provided on the face of the die to hold all the lead terminals in place on the bonding pads. In this manner the bonding energy is transmitted through the circuit chip equally and simultaneously to all bonding sites. The bonding energy can instead be applied directly to the bonding sites by pressing the bonding needle against the face of the circuit die, in contact with the lead ends. However, substantially improved results are obtained when applying the needle to the reverse side of the chip.

In order to obtain an efficient, uniform transfer of vibrational energy from the bonding needle to and through the semiconductor body, it has been found very helpful to roughen the surface of the needle tip, and to roughen the reverse side of the semiconductor body. Also, the presence of gold or other soft metal on the reverse side of the chip is to be avoided, since it would reduce the efficiency of the transfer of energy.

The rigid support means provided for the lead ends and the face of the die during the bonding step includes a pedestal or bottom needle having a roughened or knurled tip on which the free ends of the inwardly extending leads of the first frame member are positioned. The tip of the bottom needle is smaller than the dimensions of the face of the die. The tip is necessarily larger than the area formed by the inner edges of the bonding pads, and is preferably no larger than the area formed by the outer edges of the pads.

Bonding of the integrated circuit die to the leads of the first frame member is preferably carried out using automated equipment designed for operation on a lead frame supplied in continuous strip form, as mentioned above. The strip including the bonded die can then again be wound on a spool, if desired, for subsequent attachment to the second lead frame member. The degree of flexing which necessarily occurs during such an operation would impose sufficient stress upon the bonding sites to rupture a large percentage of the bonds, if a lead frame member having the stiffness required of external leads were used.

A second lead frame member is then provided, of relatively heavier gage and of larger dimensions than the first frame member, the second frame member also having a plurality of inwardly extending fingers or leads. The leads of the second frame member provide the external electrical connections of the finally completed package. The terminals of the inwardly extending leads are adapted for alignment with some portion of each corresponding lead of the first frame member. The second frame member may be constructed of Kovar, nickel, copper, steel, or other suitable metal, and is also preferably provided in the form of an elongated rectangular strip consisting of a plurality of equally spaced, identical units. A thickness of 6 to 12 mils is generally required of the second frame member, and a tensile strength of at least 30,000 p.s.i.

The second frame member is then aligned in contact with the leads of the first frame member and corresponding leads are welded or otherwise attached to one another. Preferably a resistance weld is formed, with all of the leads being welded simultaneously by means of a cylindrical welding element, for example. Other suitable methods include soldering, brazing, thermocompression bonding, ultrasonic, etc.

Either before or after completion of the welding step, excess portions of the first frame member outside the peripheral weld points are removed. They may be accomplished, for example, by simply ripping away those portions of the first frame member which extend beyond the weld points, or the excess frame material may be cut with a cylindrical knife edge in a manner analogous to the operation of a cookie cutter. The assembly is then ready for plastic encapsulation or other packaging techniques.

A further embodiment includes the step of attaching a rigid support to the leads of the first frame member, spanning the circuit die structure, to relieve the bonding sites of excessive stress in handling the molding operations prior to encapsulation. Typically the rigid support comprises a ceramic disc or plate having a diameter or side, respectively, substantially greater than the major axis of the circuit die. The leads of the frame member are attached to the ceramic disc by means of a polymeric adhesive, such as an epoxy resin. Advantageously, the adhesive is selected for its capacity to provide a passivating effect on the surface of the semiconductor structure, and is applied to an area of the ceramic plate sufficiently large to cover the semiconductor surface as well as the bonded leads, firmly binding the assembly to the ceramic support. The disc substantially improves life test stresses related to thermal cycling.

DRAWINGS

Figure 1:
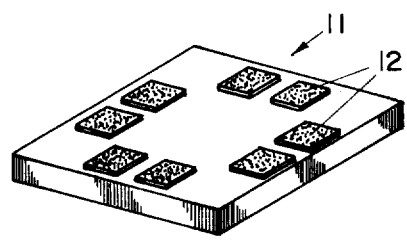
FIG. 1 is a greatly enlarged perspective view of an integrated circuit structure suitable for processing in accordance with the invention.

In FIG. 1 integrated circuit chip 11 is seen to include eight bonding pads 12 of aluminum or other suitable metal built up about 1 micron above the surrounding surface of circuit chip. It is particularly desirable to provide coplanar bonding pads, in order to improve the reliability with which all lead ends of the first frame member are attached thereto in a single bonding step. The remaining details of the integrated circuit structure are not shown since they are not essential to the concept of the present invention.

Figure 2:
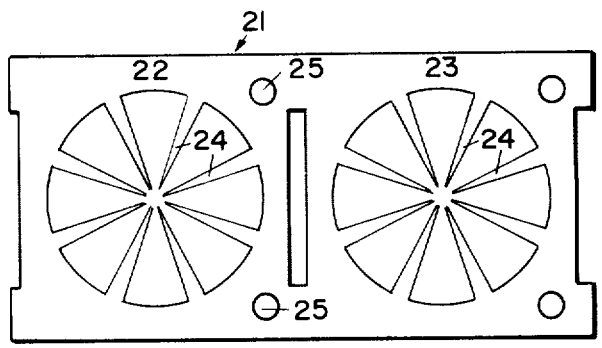
FIG. 2 is an enlarged plan view of the first frame member, showing only two units of a multi-unit strip.

FIG. 2 illustrates the geometric configuration of one embodiment of the first lead frame member of the invention. Sheet metal strip 21 includes two identical lead frame sections 22 and 23, each of which comprises a plurality of inwardly extending fingers or leads 24 corresponding in number to the number of bonding pads 12 of the circuit chip to be bonded thereto. Indexing holes 25 are provided to permit accurate positioning and alignment of the lead frame sections during the bonding operation in which the tips of leads 24 are attached to the bonding pads of the circuit chip.

Figure 3:
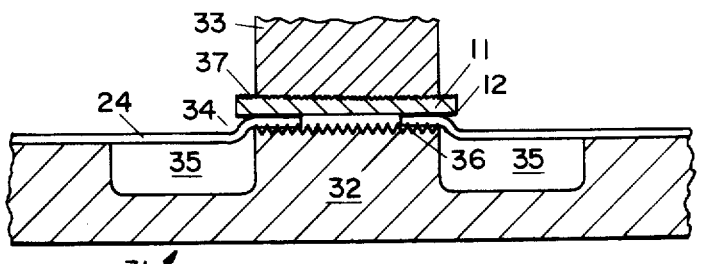
FIG. 3 is an elevational view in cross section, showing the simultaneous bonding of all lead elements of the first frame member to the corresponding bonding pads of a circuit die.

FIG. 3 illustrates the bonding of contact pads 12 to the tips of lead members 24. One lead frame section, for example, 22, is positioned on base 31 in such a manner that the ends of leads 24 are symmetrically located with respect to the center of post or pedestal 32. Circuit chip 11 is then inverted, as shown, and aligned with the ends of leads 24 such that each bonding pad 12 is placed in contact with a lead 24. A bonding needle 33 is then pressed against chip 11 and a sufficient pressure is applied, in combination with high frequency vibratory energy, preferably 5 to 100 kilocycles per sec., to complete the formation of a suitable bond securing each pad 12 to a corresponding lead 24. For example, a suitable bond is obtained at 60 k.c./sec., in only 40 to 60 milliseconds, with the application of sufficient pressure to obtain at least 20 percent deformation of the lead ends. The direction of the applied vibrations is transverse; i.e., substantially perpendicular to the axis of the bonding needle.

In order to ensure good coupling of the parts and good transmission of the vibratory energy, serrations 36 are provided in post 32, and a roughened surface is provided at the tip of needle 33. The back of die 11 is provided with a roughened surface 37.

During the bonding operation, all leads of section 22 are laterally confined such that a slight buckling action is introduced in leads 24 due to the deformation of the ends of the leads at the bonding sites. A sufficient confinement is generally provided by the frame member alone. However, additional confinement may be provided if necessary. The degree of deformation of the lead ends is at least 20 percent and preferably between 25 and 50 percent. The resulting bend 34 in each of leads 24 is sufficient to avoid the danger of shorting which would result if the edges of the circuit chip came in contact with the bonded leads. The tapering of leads 24 determines the point at which buckling occurs. That is, buckling will occur at the weakest point of the lead, which is adjacent the bonding site, and therefore well-suited to provide clearance between the leads and the edges of the chip. An annular recess 35 is provided surrounding post 32 in order to accommodate the buckling action.

Figure 4:
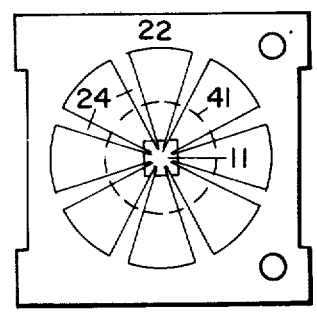
FIG. 4 is an enlarged plan view of the first frame member, including the bonded circuit die of FIG. 1.

In FIG. 4 lead frame section 22, including the bonded die 11, is shown after separation from strip 21. In accordance with an optional feature of the invention, a rigid support 41 spanning the circuit die 11 is attached to leads 24 in order to relieve the bonding sites of excessive stress. For example, support means 41 may consist of a ceramic disc attached to the leads and to the die itself by means of a polymeric adhesive.

Figure 5:
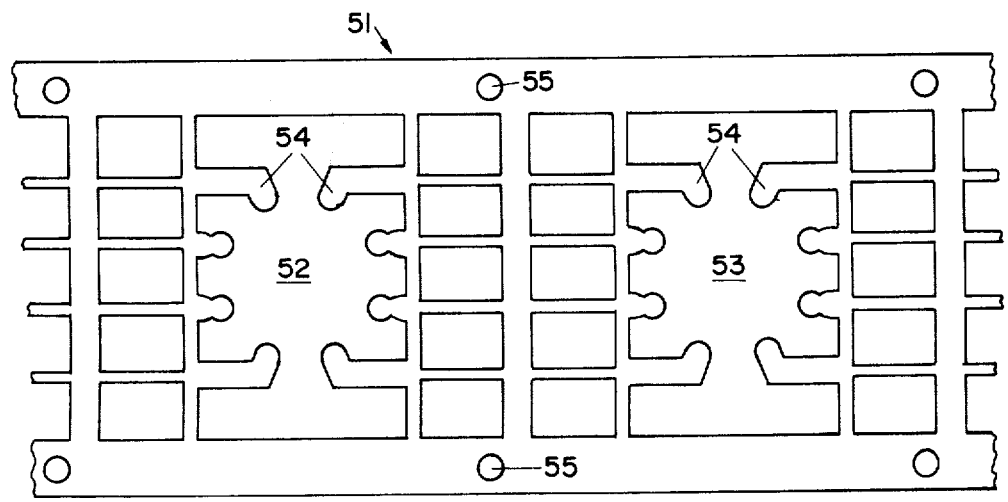
FIG. 5 is an enlarged plan view of the second lead frame member.

In FIG. 5 a second lead frame member is shown in the form of an elongated rectangular strip 51 composed of identical lead frame sections 52 and 53 comprising inwardly extending leads 54. Indexing holes 55 are provided for positioning the frame member, similarly as indexing holes 25 of the first lead frame member. Strip 51 is constructed of a heavier gage of sheet metal than strip 21 since the leads 54 must be adapted for external electrical connections extending from the completed unit.

Figure 6:
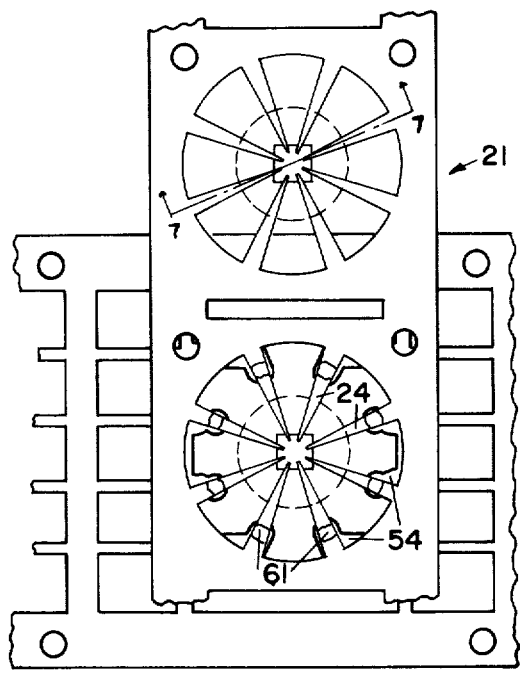
FIG. 6 is an enlarged plan view showing the leads of the first frame member welded to the leads of the second frame member.

In FIG. 6 the attachment of leads 24 to leads 54 is illustrated. This step is accomplished by placing strip 21 in contact with strip 51 whereby leads 24 are aligned with leads 54 in the manner shown. While the strips are so aligned, the lead members are welded or soldered to one another at points 61. The step of bonding the corresponding leads can be achieved in a single operation analogous to that illustrated in FIG. 3 for the attachment of the ends of leads 24 to bonding pads 12.

It will be apparent from the foregoing description that the combination of first and second lead frame members avoids the need for compromise which arises in any attempt to provide a single lead frame capable of serving both as connection means to external circuitry, and as internal connection means to the electrodes of an integrated circuit die.

Still further, a great reduction in tooling expense is provided since the exact configuration of the second lead frame member will not have to be changed in order to accommodate microcircuits having different sizes and shapes; or to accommodate microcircuits on which the bonding sites have different locations. Any such accommodation is readily made by providing the first lead frame with a different configuration, such that the leads thereof make the necessary connection between the die and the second lead frame. Thus any such tooling expense is limited to the first lead frame only, which, because of its smaller size and lighter weight involves much less expense.

Figure 7:
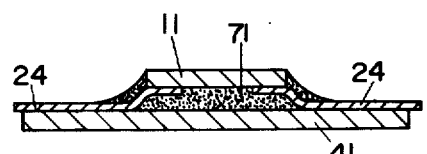
FIG. 7 is an elevational view in cross section, taken along line 7—7 of FIG. 6.

FIG. 7 is a cross section taken along line 7—7 of FIG. 6, showing the location of epoxy resin 71 or other adhesive with respect to die 11, leads 24 and ceramic disc 41.

Figure 8:
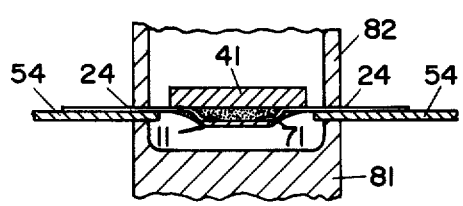
FIG. 8 is an elevational view in cross section, illustrating the step of resistance welding to attach the first lead frame member to the second lead frame member.

FIG. 8 is an elevational view, in cross section, illustrating the use of a tubular support 81 and tubular electrode 82 for resistance welding as means of attaching leads 24 of the first frame member to leads 54 of the second frame member, thereby forming weldments 61 as shown in FIG. 6.

Figure 9:
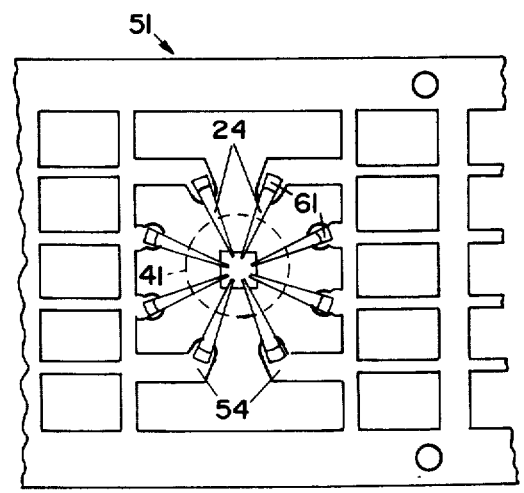
FIG. 9 is an enlarged plan view of the completed assembly, trimmed and ready for plastic encapsulation or other packaging techniques.
Figure 10:
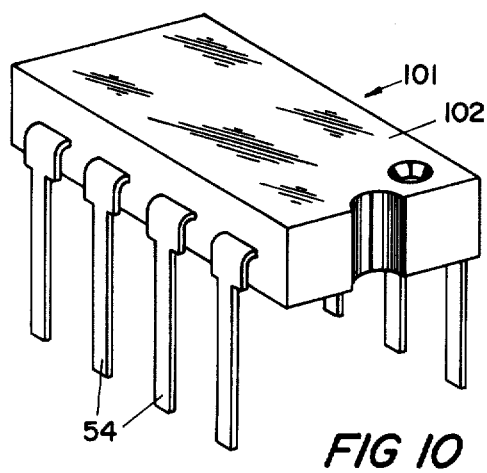
FIG. 10 is a perspective view illustrating a packaged unit wherein an assembly as shown in FIG. 9 is sealed within a plastic housing.

In FIG. 9 the completed assembly is shown after the removal of the excess portions of strip 21 leaving only those segments of leads 24 which extend inwardly from welding sites 61. The completed assembly, as shown in FIG. 8, is then packaged, after which excess portions of strip 51 are removed to provide a completed unit 101 as shown in FIG. 10. The final packaging or plastic encapsulation operation to produce the plastic case 102 of FIG. 10 is not unique to the present invention and may be carried out in accordance with any of various procedures well known in the art.

Figure 11:
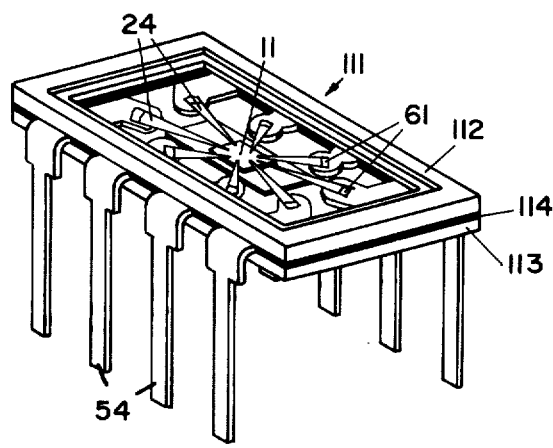
FIG. 11 is a perspective cut-away view of a hermetically sealed ceramic package illustrating the invention.

FIG. 11 is a perspective cut-away view of a hermetically sealed ceramic package 111, showing the use of upper ceramic plate 112 and lower ceramic plate 113 hermetically sealed, by means of glass seal 114, which also forms a hermetic seal surrounding leads 54.

Figure 12:
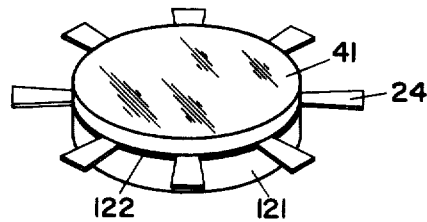
FIG. 12 is a perspective view of a "sandwich" package, in which the circuit die is cemented between two ceramic discs or plates.

In accordance with an additional embodiment of the invention, as shown in FIG. 12, the assembly of FIG. 4 may be further modified by cementing a second ceramic disc 121 to the reverse side of the circuit die, thereby sandwiching the chip between two ceramic plates or discs. A preferred cement or adhesive to be used for this purpose is an epoxy resin, such as polyethylene epoxide. For some applications, the ceramic sandwich is sufficient as a complete external package. That is, the leads 24 may be severed from frame 22 to provide a finished, marketable unit consisting of die 11 and leads 24 sandwiched between two ceramic discs and sealed together by a synthetic resin adhesive 122.

We claim:

1. An integrated circuit semiconductor device adapted to be produced with automated steps in the assembly thereof, said device including metal portions within housing means and extending outside said housing means for such device, said metal portions all having been originally a part of a substantially one piece flat metal strip including a plurality of lead frame sections in the strip and each lead frame section having a plurality of leads comprising said ultimate metal portions of the semiconductor device, each said metal portion in said device having an inner portion extending toward an originally open central area in the original frame section and an outer portion extending outwardly therefrom, said original metal strip and each integral frame section thereof being less than 4.0 mils thick and characterized by a flexibility such that the metal strip with an integrated circuit semiconductor unit bonded to the leads of each frame section thereof can be wound on a spool for handling said strip from which said strip is unwound for use as needed in the manufacture of semiconductor devices, said semiconductor device having an integrated circuit semiconductor unit positioned at said central area and bonded to said inner lead portion of each lead in a frame section by means of a single bonding step, housing means for a portion of each of said metal portions and the semiconductor unit bonded thereto, and with a portion of each original frame section being severable from the outer portions of said original leads to separate each lead from the others in a frame section, said housing means being round in configuration and with the outer portions of each metal portion in the device extending in a spaced apart circular pattern outside said housing means for connecting the semiconductor device with apparatus in which the device is to be used.

2. In an integrated circuit semiconductor device as defined in claim 1, wherein the housing means includes a pair of round ceramic discs with one disc on each side of the device.

* * * * *